US006284418B1

(12) United States Patent
Trantolo (10) Patent No.: US 6,284,418 B1
(45) Date of Patent: Sep. 4, 2001

(54) BIOPOLYMER-BASED OPTICAL ELEMENT

(75) Inventor: Debra J. Trantolo, Princeton, MA (US)

(73) Assignee: Cambridge Scientific, Inc., Cambridge, MA (US)

( * ) Notice: Subject to any disclaimer, the term of this patent is extended or adjusted under 35 U.S.C. 154(b) by 0 days.

(21) Appl. No.: 09/441,244

(22) Filed: Nov. 16, 1999

Related U.S. Application Data
(60) Provisional application No. 60/108,638, filed on Nov. 16, 1998.

(51) Int. Cl.[7] ............................... G11B 7/24; C09K 19/38
(52) U.S. Cl. ................................ 430/20; 430/19; 430/2; 430/1; 349/183; 349/165
(58) Field of Search ...................... 349/183, 165; 430/19, 20, 1, 2; 252/299.1, 299.68

(56) References Cited

U.S. PATENT DOCUMENTS

| | | | |
|---|---|---|---|
| 4,857,427 | * | 8/1989 | Itoh et al. ........................... 430/20 |
| 5,097,016 | * | 3/1992 | Ishii et al. .......................... 530/350 |
| 5,200,108 | * | 4/1993 | Yuasa et al. ....................... 349/183 |
| 5,252,719 | * | 10/1993 | Takeda et al. ..................... 530/409 |
| 5,296,321 | * | 3/1994 | Kawanishi et al. ................. 430/20 |

FOREIGN PATENT DOCUMENTS

WO94/05008 * 3/1994 (WO) .
WO96/38410 * 12/1996 (WO) .

OTHER PUBLICATIONS

Viguera et al., "A Water Soluble polylysine–retinaldehyde Schiff base", J. Biol. Chem., vol. 265(5), pp. 22527–2532, Feb. 1990.*

Stumpe et al., "Photo–orientation in LB multilayers . . . " Thin Solid Films, vol. 284–254, pp. 606–611, 1996.*

Gallot et al., "Liquid Crystaline structure of poly(l–lysine) . . . " Macromol. Rapid Commun., vol. 17(8), pp. 493–501, 1996.*

Menzel et al., "Langumuir–Blodgett films of photochromic polyglutamates . . .", Thin Solid Films, vol. 223, pp. 181–188, 1993.*

Menzel et al., "Langmuir–Blodgett films of photochromic polyglutamates . . . ", Macromol. Chem. Phys., vol. 198, pp. 2073–2087, 1997.*

Menzel et al., "Structureal invenstigations on LB films . . . " Thin Solid Films, vol. 242, pp. 56–60, 1994.*

* cited by examiner

Primary Examiner—Martin Angebranndt
(74) Attorney, Agent, or Firm—Sampson & Associates (57) ABSTRACT

Provided is an optical element comprising a biopolymer having an oriented structure and a photoresponsive compound, such as a photochromic compound, wherein at least a portion of the photoresponsive compound is incorporated within the oriented structure of the biopolymer and wherein the oriented structure is laminar with the planes of the laminar orientation being aligned perpendicular to a surface of the optical element. Preferably, the biopolymer is a liquid crystal polypeptide, such as ferroelectric liquid crystal poly(γ-methyl-L-glutamate), and the photochromic compound is bacteriorhodopsin. Such optical elements may be utilized in a holographic grating, in an optical correlator system such as for pattern recognition, in a dynamic holographic recording system, and in an optical switch.

5 Claims, 4 Drawing Sheets

BIOPOLYMER-BASED OPTICAL ELEMENT

RELATED APPLICATION

This application claims priority to U.S. Provisional Patent Application Ser. No. 60/108,638, titled "Improved Holographics for Information Storage and Retrieval," filed on Nov. 16, 1998, the disclosure of which is fully incorporated herein by reference.

Part of the work leading to this invention was made under a United States Government contract with the National Science Foundation (DMI-9760996). The U.S. Government may have certain rights in this invention.

FIELD OF THE INVENTION

The present invention relates to the field of optical elements and, particularly, pertains to optical elements for use as holographic optical elements. More specifically, this invention pertains to optical elements comprising an oriented structure of a biopolymer and a photoresponsive compound, such as a photochromic compound, wherein at least a portion of the photoresponsive compound is incorporated within the oriented structure of the biopolymer and wherein the oriented structure is laminar with the planes of the laminar orientation being aligned perpendicular to a surface of the optical element. Preferably, the biopolymer is a liquid crystal polypeptide, such as ferroelectric liquid crystal poly(γ-methyl-L-glutamate), and, preferably, the photoresponsive compound is a photochromic bacteriorhodopsin. Also provided are methods for preparing such optical elements utilizing an electric field poling process followed by doping or reactive attachment of the photoresponsive compound into the oriented biopolymer film.

BACKGROUND OF THE INVENTION

Information fraud is a serious problem for banks, businesses, and consumers. Fast personal identification is verified by the use of photographic identification cards, credit cards, and other cards. However, with the rapid advances in image processing technology such as scanners, printers, and copiers, it has become increasingly simple to reproduce authentic looking fingerprints, pictures, and patterns. Techniques such as the embossed hologram on credit cards are no longer a reliable solution to the problem because they can be easily copied. There is therefore a need to develop more technically sophisticated systems to handle the counterfeiting problem.

There has been a surge in interest in biometrics (for example, unique signatures such as facial features, fingerprints, retina, voice patterns, and DNA) as part of a security system to protect sensitive information such as financial transactions. Also, in light of the present ease of circumventing security measures, such as passwords, in order to access computer information, computer and financial companies have a strong interest in implementing some form of biometric protection device to secure information held by personal computers. To counteract these fraudulent practices, all-optical correlator systems have been developed. For example, an all-optical spatial correlation of two phase-encoded images in a photochromic material in a four-wave mixing configuration may be utilized to inspect and verify biometrics. In particular, one phase-encoded biometric may be affixed to a product such as an identification card. The other phase biometric is stored in the security system for comparison with the object biometric. This biometric is then verified by the optical correlator that incorporates a holographic filter in order to verify authenticity.

Complex phase/amplitude patterns that cannot be seen and cannot be copied by an intensity-sensitive detector such as a charge-coupled device (CCD) camera are utilized for verification of the authenticity of items bearing the holography. Biometrics can be imaged on thin plastic materials using embossing techniques such as those used to imprint the holograms found on many cards. The code in the biometric is known only to the authorized producer of the card. The phase portion of the pattern consists of a two dimensional holography, which is invisible under ordinary light. The biometric cannot be analyzed by looking at the card under a microscope, photographing it, or reading it with a computer scanner in an attempt to reproduce it. However, a combination of performance limitations and the high cost of existing optical materials has limited the application of all-optical correlator systems.

Several types of materials have been investigated for holographic all-optical correlators. Among these are inorganic photorefractive crystals, photorefractive polymers, and photodynamic proteins, such as bacteriorhodopsin. Inorganic photorefractive crystals, such as $BaTiO_3$, $KNbO_3$, and $LiNbO_3$, have been investigated, such as described by White et al., Phys. Lett., Vol. 37, pages 5–7 (1980), but their difficulty of processing and high cost have limited their widespread use. Photorefractive polymers have received attention because they can be made into thin films, and after poling exhibit photorefractive properties, such as described by Moerner et al., J. Opt. Soc. Am., Vol. 11, pages 320–330 (1994); Meerholz et al., Nature, Vol. 371, pages 497–500 (1994); Volodin et al., Nature, Vol. 383, pages 58–60 (1996); Kippelen et al., Proc. SPIE, Vol. 3144, pages 176–184 (1997); and Wada et al., Proc. SPIE, Vol. 3144, pages 186–194 (1997). For example, all optical encoding of documents has been tried using a holographic filter based on a photorefractive polymer [2,5-dimethyl-4-(p-nitrophenylazo) anisole; poly(N-vinylcarbazole); N-ethylcarbazole; 2,4,7-trinitro-9-fluorenone], as described by the above-referenced publications by Meerholz et al., and Volodin et al. Problems related to chromophore crystallization and phase separation were responsible for the early failure of these types of polymers. To increase stability, modifications of the composite polymer were tried, but they caused a reduction in the diffraction efficiency of the holographic filter.

One of the drawbacks of photorefractive polymers has been the high electric field strengths needed in order to align the chromophores. In contrast, liquid crystals can be aligned using much lower fields, as described by Wiederrecht et al., Science, Vol. 270, pages 1794–1797 (1995), and Khoo et al., Opt. Lett., Vol. 19, pages 1723–1725 (1994). The majority of liquid crystals are based on the twisted nematic (TN), supertwisted nematic (STN), and active matrix (TFT) models. With an electric field applied, the molecules reorient parallel to the normal. However, there is a finite switching speed which may cause problems when fast switching is required. The response time for a typical STN device is about 200 milliseconds and for a TN device is about 30 to 50 milliseconds. Another technique to reduce switching time is the use of ferroelectric smectic liquid crystals (FSLC), as described, for example, by Lacey, "Liquid Crystals and Devices," in Introduction to Molecular Electronics, Petty et al. (eds.), Oxford University Press, New York, pages 185–219 (1995), for fast switching LC materials for display applications. Ferroelectric liquid crystals are being developed to provide fast switching LC displays, fast enough for television and other real-time applications. In smectic liquid crystals, there is a tendency for molecules to cluster into separate planar sheets. A special case of these is the class of cholesteric liquid crystals where the directrix lies in the plane of the ordered layers but rotates from layer to layer to trace out a helix. Biopolymers belonging to this class may effectively compete with inorganic, organic, and polymeric optical materials particularly with respect to cost, environmental stability, and performance.

Biological molecules may be used to fabricate devices with smaller sizes and faster data handling capabilities than currently available semiconductor devices. Proteins in particular have proven to be well suited for applications in optical information processing and all-optical computing. Photochromic materials such as bacteriorhodopsin (bR) have been actively investigated with a view to a number of applications including holography, optical RAM (random access memory), and optical information processing. Bacteriorhodopsin and photopolymers containing bR are well suited to the development of real-time holographic materials for optical information processing, all-optical computing, and other applications in photonics. For example, a bR-based all-optical correlator using the $bR_{96N}$ mutant in a Fourier optical architectural scheme that implemented spatial frequency filtering on an input image was described by Thoma et al. in *Opt. Lett.*, Vol. 16, pages 651–653 (1991), in *Opt. Lett.*, Vol. 17, pages 1158–1163 (1992), and in *Opt. Eng.*, Vol. 34, pages 1345–1351 (1995). Owing to the fact that proteins such as bacteriorhodopsin are typically more sensitive to light than inorganic crystals, a molecular switch may be realized with very low light levels.

Although bacteriorhodopsin has shown promise as a holographic material, its use has been limited by low diffraction efficiency. An optical element, such as a holographic grating or a holographic filter, that retains the desirable properties of the photoresponsive compound, such as photochromic bacteriorhodopsin, while overcoming limitations such as low diffraction efficiency and stability against phase separation and crystallization, would be advantageous for optical correlator systems, dynamic holographic recording systems, holographic gratings and filters, optical switches, and other related optical, electro-optic, and thermo-optic systems.

SUMMARY OF THE INVENTION

The present invention increases the holographic capability of an optical element by coupling a photoresponsive compound, such as bacteriorhodopsin and other photochromic compounds, to a liquid crystal (LC) system which offers changes in birefringence in the writing of the hologram. Given that a key issue is the magnitude of the real component of the refractive index, changing the birefringence is a useful approach. In writing the hologram, the LC's may go from isotropic to an ordered dispersion or vice versa, a property which can be linked to those of the photoresponsive compound, such as bacteriorhodopsin, in order to improve real-time holographic efficiency. One application for this linking of a photoresponsive compound to a LC system which offers a change in birefringence is an all-optical correlator system with reasonable access times and high real-time holographic efficiencies for pattern recognition in security applications. For example, the pattern of the biometrics may be inspected by obtaining an all-optical spatial correlation of two phase-encoded images in the photoresponsive/LC film of the present invention utilizing a four-wave mixing configuration. The biometric pattern is then verified by the optical correlator with the photoresponsive/LC holographic filter, such as the bR/LC holographic filter, to verify authenticity.

In a preferred embodiment, the all-optical correlator system is based on the photochromic protein bacteriorhodopsin coupled to a biopolymer ferroelectric liquid crystal, such as poly(γ-methyl-L-glutamate), PMLG. This is a novel class of materials which combines the excellent photochromic abilities of bacteriorhodopsin with the field-dependent transmission properties of liquid crystals. This makes them promising materials for use in optical applications such as a relatively low cost pattern recognition system for security applications. For example, incorporation of bacteriorhodopsin in liquid crystal (LC) biopolymers was found to provide a high real index of refraction change upon illumination and gave high hologram dynamic diffraction efficiency for real-time optical applications. For example, holographs with bacteriorhodopsin/LC based biopolymeric films provided 20 times higher diffraction efficiency than a high quality $Bi_{12}SiO_{20}$ (BSO) photorefractive crystal. The ease of manufacture of the organic bacteriorhodopsin-based biopolymeric films or layers is advantageous for the use of these materials in holographic filters and other optical applications.

One aspect of the present invention pertains to an optical element comprising an optical layer having a first major surface and a second major surface opposite to the first surface, which layer comprises a biopolymer having an oriented structure and a photoresponsive compound, wherein at least a portion of the photoresponsive compound is incorporated within the oriented structure of the biopolymer and wherein the oriented structure is laminar with the planes of the laminar structure being aligned perpendicular to at least one of the first and second major surfaces. In one embodiment, the biopolymer, preferably a polypeptide, comprises an α-helix molecular conformation. In one embodiment, the center line or molecular axis through the α-helix molecular conformation is parallel to at least one of the first and second major surfaces. In one embodiment, the biopolymer is a poly(γ-alkyl-L-glutamate). In a preferred embodiment, the biopolymer is poly(γ-benzyl-L-glutamate). In a more preferred embodiment, the biopolymer is poly(γ-methyl-L-glutamate).

In a preferred embodiment of the optical elements of this invention, the biopolymer is a liquid crystal and, more preferably, the biopolymer is a ferroelectric liquid crystal. In a most preferred embodiment, the oriented biopolymer structure of the optical elements of the present invention is formed by applying an electric field between a pair of electrodes and parallel to a surface of a solution of a biopolymer and a helicogenic solvent and subsequently evaporating the helicogenic solvent. In one embodiment, the planes of the laminar structure of the oriented biopolymer are parallel to each other. In one embodiment, the planes of the laminar structure are curved. In one embodiment, the thickness of the optical layer is from 15 to 100 microns.

In one embodiment of the optical elements of the present invention, the photoresponsive compound is a photochromic compound. Suitable photochromic compounds include, but are not limited to, rhodopsins, such as bacteriorhodopsin, and spiropyrans. In one embodiment, the photoresponsive compound is a photorefractive compound. In one embodiment, the photoresponsive compound is incorporated into the oriented structure of the biopolymer by contacting a solution of the photoresponsive compound, a doping solvent and, optionally, other additives such as a surfactant and a polymer binder, onto the biopolymer and subsequently evaporating the doping solvent. In one embodiment, at least a position of the photoresponsive compound is covalently bonded to the biopolymer. In a preferred embodiment, the photoresponsive compound is bacteriorhodopsin and at least a portion of the bacteriorhodopsin is covalently bonded to the biopolymer. In a more preferred embodiment, the biopolymer is poly(γ-methyl-L-glutamate), the photoresponsive compound is bacteriorhodopsin, and at least a portion of the bacteriorhodopsin is covalently bonded to the poly(γ-methyl-L-glutamate).

In one embodiment of the optical elements of this invention, the photorespnsive compound absorbs visible radiation. In one embodiment, the photoresponsive compound absorbs infrared radiation, preferably infrared radiation in the wavelength range of 700 to 1000 nm, more preferably in the wavelength range of 1000 to 1400 nm, and most preferably in the wavelength range of 1400 to 1700 nm.

In one embodiment of the optical elements of the present invention, the optical element is utilized in an optical correlator system. In one embodiment, the optical element is utilized in a holographic grating. In one embodiment, the optical element is utilized in a dynamic holographic recording system. In one embodiment, the optical element is utilized in an optical switch.

Another aspect of this invention pertains to methods of preparing an optical element, which methods comprise the steps of (a) providing a biopolymer solution comprising a biopolymer in a helicogenic (helix-inducing) solvent, which biopolymer forms an α-helix structure in the biopolymer solution; (b) dispensing the biopolymer solution between a pair of electrodes, which biopolymer solution has a surface; (c) applying an electric field between the electrodes and parallel to the surface of the biopolymer solution to thereby orient the biopolymer with respect to the electric field, wherein the helicogenic solvent simultaneously evaporates upon the application of the electric field to form an oriented biopolymer film; and (d) incorporating a photoresponsive compound into the biopolymer film. In one embodiment, step (d) comprises contacting a solution of the photoresponsive compound, such as bacteriorhodopsin, a doping solvent, and optionally, other additives such as a surfactant and a polymer binder, onto the biopolymer film and subsequently evaporating the doping solvent. In one embodiment, step (d) comprises reacting a reactive precursor of the photoresponsive compound, such as bacteriorhodopsin, with a reactive precursor of the biopolymer to form the photoresponsive compound covalently bonded to the biopolymer. In one embodiment, the biopolymer solution is dispensed into a mold in step (b), and the oriented biopolymer film is removed from the mold subsequent to step (c). In one embodiment, the biopolymer solution is dispensed onto a temporary carrier substrate in step (b), and the oriented biopolymer film is removed from the temporary carrier substrate subsequent to step (c).

As will be appreciated by one of skill in the art, features of one aspect or embodiment of the invention are also applicable to other aspects or embodiments of the invention.

DETAILED DESCRIPTION OF THE INVENTION

Liquid crystals are of considerable interest in the development of real-time holographic devices such as optical correlators for pattern recognition. Although many of the real-time holographic materials currently available are based on inorganic crystals, there is considerable interest in the development of polymeric devices, due to their structural flexibility, ease of processing, and lower cost.

Another of the main advantages of using liquid crystals is the much lower voltage that needs to be applied to reorient its dipoles, as described, for example, by Khoo et al., *Opt. Lett.*, Vol. 19, pages 1723–1725 (1994), and Wiederrecht et al., *Science*, Vol. 270, pages 1794–1797 (1995). Holograms written with poled liquid crystals consist of bulk space-charge patterns. In the electro-optic effect, an interference pattern acting upon this poled material generates a pattern of electronic charge carriers that are free to move. Carriers move to areas of low optical illumination where they get trapped. This effect forms patterns of net space charge creating an electrical field pattern. As these liquid crystals have strong electro-optic properties, the electrical field creates a corresponding refractive-index variation pattern, which means a phase diagram.

An attractive aspect of many biopolymers is their liquid crystalline properties, as, for example, described in U.S. Pat. No. 5,009,489 to Eguchi et al. for ferroelectric liquid crystals. Polymer gels with cholesteric LC order have been prepared and show a cholesteric-isotropic reversible transition accompanied by the helix-coil transition of poly(γ-benzyl-L-glutamate) (PBLG) molecules, as described by Kishi et al., *Macromolecules*, Vol. 23, pages 3779–3784 (1990). These gels have been used to orient dye molecules introduced either by doping or by covalent linkages, as described by Sisido et al., *Macromolecules*, Vol. 24, pages 4110–4114 (1991). U.S. Pat. No. 5,597,457 to Craig et al. describes methods to utilize the self-assembly and electric field alignment of α-helical polypeptides for forming synthetic crystals of proteins. The term "biopolymer," as used herein, pertains to all biological polymeric materials and to their synthetic polymeric analogs, such as the synthetic polypeptides.

Toth et al., *Polymer Lett.*, Vol. 8, page 531 (1970), applied electric fields perpendicular to 15% solutions of PBLG in chloroform and noticed the emergence of dark fields in previously birefringent solutions. On slight shearing, birefringence reappeared as multicolored bands perpendicular to the shear direction. The disappearance of the birefringence was due to the perpendicular orientation of the solute molecules with respect to the plane of the film which reverted to an orientation in the plane on shear. Go et al., *Biochim. Biophys. Acta.*, Vol. 175, page 454 (1970), observed similar banded structures on application of a magnetic field of 9600 Gauss to a 15% solution of PBLG in methylene dibromide. Kiss et al., *Mol. Cryst. Liq.*, Vol. 60, pages 267–280 (1980), in a study of aligned PBLG prepared by shearing solutions observed bands in the film surface perpendicular to the shear direction which they termed "row-nucleated structures."

Films of PBLG which have not been poled consist of randomly oriented helices, the aggregate of which is therefore centrosymmetric. Orientation by poling removes this condition giving rise to non-centrosymmetry, and potentially to an increase in the index of modulation of the refractive index. Because alignment or molecular orientation confers bulk non-centrosymmetry on a sample, oriented polymers also display birefringence. For example, cholesteric order has been found using an in-plane poling process with the helical PBLG, as described in U.S. Pat. No. 5,512,218 to Gresser et al. This process produced increased birefringence, i.e., an increase in the polarization-dependent refractive index. Given that an important property is the magnitude of the real component of the refractive index, increasing the birefringence is a useful approach in improving holographic efficiency. In writing the hologram, the liquid crystals go from isotropic to an ordered dispersion or vice versa, a property which may be linked to those of a photoresponsive compound to improve holographic diffraction efficiency.

One aspect of the present invention pertains to an optical element comprising an optical layer having a first major surface and a second major surface opposite to the first major surface, which layer comprises a biopolymer having an oriented structure and a photoresponsive compound, wherein at least a portion of the photoresponsive compound is incorporated within the oriented structure of the biopolymer and wherein the oriented structure is laminar with the planes of the laminar structure being aligned perpendicular to at least one of the first and second major surfaces. In one embodiment, the biopolymer, preferably a polypeptide, comprises an α-helix molecular conformation. In one embodiment, the center line or molecular axis through the α-helix molecular conformation is parallel to at least one of the first and second major surfaces. In one embodiment, the biopolymer is a poly(γ-alkyl-L-glutamate).

In a preferred embodiment, the biopolymer of the optical elements of the present invention is poly(γ-benzyl-L-glutamate) (PBLG), as, for example, described in U.S. Pat. No. 5,512,218 to Gresser et al. For example, optical alignment or orientation of PBLG liquid crystals in a helicogenic solvent such as methylene chloride was achieved by orienting a (nominally) 115 kD PBLG biopolymer while applying a field of 0.2 V/micron, or about 3 orders of magnitude less than the voltage required to align photorefractive polymers.

In a more preferred embodiment, the biopolymer of the optical elements of this invention is poly(γ-methyl-L-glutamate) (PMLG). PMLG has the advantageous property of strong ferroelectric properties for use in the optical elements of this invention, particularly when PMLG is oriented using the methods described in U.S. Pat. No. 5,512,218 to Gresser et al. Also, PMLG-based optical elements of this invention are suitable for use in electro-optic elements, and PMLG in these various optical elements is typically able to reorient its dipoles under low applied voltages.

In a preferred embodiment of the optical elements of this invention, the biopolymer is a liquid crystal and, more preferably, the biopolymer is a ferroelectric liquid crystal. In a most preferred embodiment, the oriented biopolymer structure of the optical elements of the present invention is formed by applying an electric field between a pair of electrodes and parallel to a surface of a solution of a biopolymer and a helicogenic solvent and subsequently evaporating the helicogenic solvent. In one embodiment, the planes of the laminar structure of the oriented biopolymer are parallel to each other. In one embodiment, the planes of the laminar structure are curved. In one embodiment, the thickness of the optical layer is from 15 to 100 microns.

In-plane alignment of the LC host, for example, by application of an electric field parallel to the liquid field surface as described in U.S. Pat. No. 5,512,218 to Gresser et al., was found to depend on a number of variables, most notably the choice of plasticizer or solvent, the molecular weight of the polymer, and the field strength.

In one embodiment of the optical elements of the present invention, the photoresponsive compound is a photochromic compound. Suitable photochromic compounds include, but are not limited to, rhodopsins, such as bacteriorhodopsin; and spiropyrans. For example, U.S. Pat. No. 5,518,858 to Dyukova et al. describes some of the retinal-protein complex properties of bacteriorhodopsin and a photochromic composition comprising an aqueous bacteriorhodopsin suspension.

Like most complex organic materials, bacteriorhodopsin (bR) lends itself to many manipulations to various isomers or derivatives through the use of synthetic chemistry and molecular engineering which permit modification of its optical properties to suit the requirements of a certain technological application without degradation of its inherent mechanical and thermal stability or other physical characteristics. From the point of view of optical engineering, this provides bR with distinct advantages over many other optical materials. For example, U.S. Pat. No. 5,374,492 to Hampp et al. describes chemical modifications to bR to increase holographic diffraction efficiency.

In addition to high quantum yields for photochromic response, bR has several intrinsic properties of importance in optical engineering. First, bR exhibits a large absorption cross-section. Second, bR when oriented displays a photoelectric field. Third, bR is a two dimensional protein which has the structure of a hexagonal array of trimers with intercalated lipids which confers a crystal like architecture to bR. This structure is to some extent the reason why bR is very stable. Furthermore, adaptation to high salt environments makes bR very robust against degradation by environmental perturbations and thus, unlike many other biological materials, bR does not require special storage. Dry films containing bR have been stored for several years without degadation, as described by Varo et al., *Biophys. J.*, Vol. 43, page 47 (1983). Light sensitive proteins such as bR have been optimized by evolution for millions of years; thus bR also exhibits extremely high stability towards photodegradation. No noticeable change is observed after a bR film is switched between the B and M states of bR for over a million times using a quartz lamp with appropriate color filters. Also, as reported by Shen et al., *Nature*, Vol. 366, page 48 (1993), dry films containing bR are structurally stable up to a temperature of 140° C. U.S. Pat. No. 5,346,789 to Lewis et al. describes an oriented bacteriorhodopsin/polyvinyl alcohol (PVA) film, formed from drying a bR/PVA solution, for use in optical information storage and as an optical switch. U.S. Pat. No. 5,757,525 to Rao et al. describes the use of photochromic materials, such as bacteriorhodopsin, in all-optical devices, such as optical switches.

A thin film of bR may act as a voltage controlled bistable optical device (B state of bR in a reversible photoreaction with the M state of bR). This suggests that bR has significant potential as an active medium in optical correlation. Bacteriorhodopsin has a very large dipole moment (about 100–500 D depending upon pH) and carries a negative charge of −3, as described by Birge et al., "Biomolecular Optoelectronics" in *Introduction to Molecular Electronics*, Petty et al. (eds.), Oxford University Press, New York, pages 315–344 (1995). Modest electric fields are known to generate near perfect orientation of bR. This orientation is required in order to utilize the macroscopic electro-optic effect of bR. To obtain this electro-optic effect, the originally randomly oriented bR present in the LC biopolymer have to be aligned by an electric field ("poling"). Besides alignment of the bR, the poling also provides the net force for the drift of carriers. Alignment in the plane of the film leads to components of the dipole moment vector directed perpendicular to the plane of the film. Birge et al. in U.S. Pat. No. 5,228,001 describe the use of a bacteriorhodopsin film for an electro-optic random access memory. U.S. Pat. No. 5,253,198 to Birge et al. describes a three-dimensional optical memory based on the photochromic and electrical properties of bacteriorhodopsin.

Some of the other properties of bR which are important in real-time holographic pattern recognition are that more than 106 write/erase cycles have been demonstrated without any observable degradation of the photochromic properties of films containing bR. Fitzpatrick in U.S. Pat. No. 5,563,704 describes a high speed, high resolution camera and method for holographic interferometry using a bacteriorhodopsin-based photosensitive film. The spatial resolution of films containing bR was found to be more than 5000 lines/mm, as described by Sabert et al., *Appl. Phys. Lett.*, Vol. 58, page 2323 (1991). The photochromic properties of bR are dominated by the initial B state (absorption maximum at 570 nm) and the blue-shifted M state (absorption maximum of 410 nm), both of which are photochemically active and spectrally well separated. However, in bacteriorhodopsin, the modulation of the refractive index component is small, leading to a low efficiency optical device. In one approach to overcome this, U.S. Pat. No. 5,223,355 to Hampp et al. describes polarization-related processes for improving the signal-to-noise ratio in holography using bacteriorhodopsin-based recording media.

Meerholz et al., *Nature*, Vol. 371, pages 497–500 (1994), and Volodin et al., *Nature*, Vol. 383, pages 58–60 (1996) have reported that birefringence modulation was responsible for a diffraction efficiency nearing 100% in novel photorefractive materials. However, these materials showed a reduced lifetime and premature failure due to chromophore crystallization and phase separation. Also, the applied field required to induce this modulation is too high.

In one embodiment of the optical elements of this invention, the photoresponsive compound is a photorefractive compound. In one embodiment, the photoresponsive compound is incorporated into the oriented structure of the biopolymer by contacting a solution of the photoresponsive compound, a doping solvent, and, optionally, other additives such as a surfactant and a polymer binder, onto the biopolymer and subsequently evaporating the doping solvent. In one embodiment, at least a portion of the photoresponsive compound is covalently bonded to the biopolymer. In a more preferred embodiment, the biopolymer is poly(γ-methyl-L-glutamate), the photoresponsive compound is bacteriorhodopsin, and at least a portion of the bacteriorhodopsin is covalently bonded to the poly(γ-methyl-L-glutamate).

In one embodiment of the optical elements of this invention, the photorespnsive compound absorbs visible radiation. In one embodiment, the photoresponsive compound absorbs infrared radiation, preferably infrared radiation in the wavelength range of 700 to 1000 nm, more preferably in the wavelength range of 1000 to 1400 nm, and most preferably in the wavelength range of 1400 to 1700 nm. The wavelength range of 1300 to 1700 nm is particularly important for optical applications in fiber-optic telecommunications. As used herein, the terms "visible radiation" and "infrared radiation" pertain to the wavelength ranges of 400–700 nm and 700–2000 nm, respectively. The term "photoresponsive compound," as used herein, pertains to compounds which absorb radiation in the visible and infrared radiation ranges of 400 to 2000 nm and which, upon absorption of this radiation, exhibit photochromic, or photorefractive or other nonlinear optical properties.

Another aspect of the optical elements of the present invention is the optimization of the index of modulation of composite bacteriorhodopsin/oriented biopolymer layers or films. One application for such optical elements would be holographic materials to function in all-optical correlator systems for security applications. For example, optical correlators based on dynamic holographic materials are necessary to the development of an efficient and low-cost pattern recognition system. Current dynamic holographic materials show a low holographic efficiency. Many high efficiency materials are static instead of dynamic. Bacteriorhodopsin (bR) is photochromic and may form the basis for many dynamic holographic materials. However, the modulation of the imaginary refractive index component in bR is small, resulting in a low efficiency device.

The combination of oriented liquid crystals with bR has an additional advantage for dynamic holographic applications. The resolution of liquid crystals is limited and the photorefractive performance is low for small values (less than 5 microns) of the grating spacing, as described, for example, in Wiederrecht et al., *Science*, Vol. 270, pages 1794–1797 (1995), and Khoo et al., *Opt. Lett.*, Vol. 19, pages 1723–1725 (1994). However, the resolution may be improved by coupling the liquid crystals in an oriented or aligned conformation with bR. Highest resolution is obtained by careful adjustment of the laser write and read beam intensities. With bR, holograms can be recorded in pure phase, pure absorption or mixed modes with recording wavelengths from 400 to 700 nm and readout from 400 to 850 nm. The recording sensitivity of bR alone is in the range of 1 to 80 mJ/cm$^2$. An additional advantage of using this protein as an optical recording medium is its small size (about 50 nm in diameter) relative to the wavelength of light. This results in diffraction limited performance (greater than 5000 lines/mm), as described by Birge et al., "Biomolecular Optoelectronics," in *Introduction to Molecular Electronics*, Petty et al. (eds.), Oxford University Press, New York, pages 315–344 (1995). Hence, there is a particular advantage to improve the diffraction efficiency of bR by coupling with oriented liquid crystals due to the inherent high resolution of bR.

In one embodiment of the optical elements of the present invention, the optical element is utilized in an optical correlator system. In one embodiment, the optical element is utilized in a holographic grating. In one embodiment, the optical element is utilized in a dynamic holographic recording system. In one embodiment, the optical element is utilized in a optical switch.

The optical elements of this invention may also be utilized in electro-optic, thermo-optic, and other hydrid optical systems, as known in the art, where the nonlinear optical behavior and other properties of the oriented biopolymer and the optical, electrical, and other properties of the photoresponsive compound in the aligned biopolymer host may be combined with an electrical, thermal, or other non-photonic input or output. U.S. Pat. No. 5,279,932 to Miyasaka et al. describes an optical response element for an electro-optic system in which the photoreceptor layer comprising a molecularly oriented photosensitive chromoprotein, such as bacteriorhodopsin, and a liquid crystal layer are separate layers with a polymer film layer for liquid crystal orientation interposed between them. Also, the optical elements of the present invention are suitable for use in purely holographic applications and also for other applications which include intermediate or partial steps involving holography.

Figure 1:
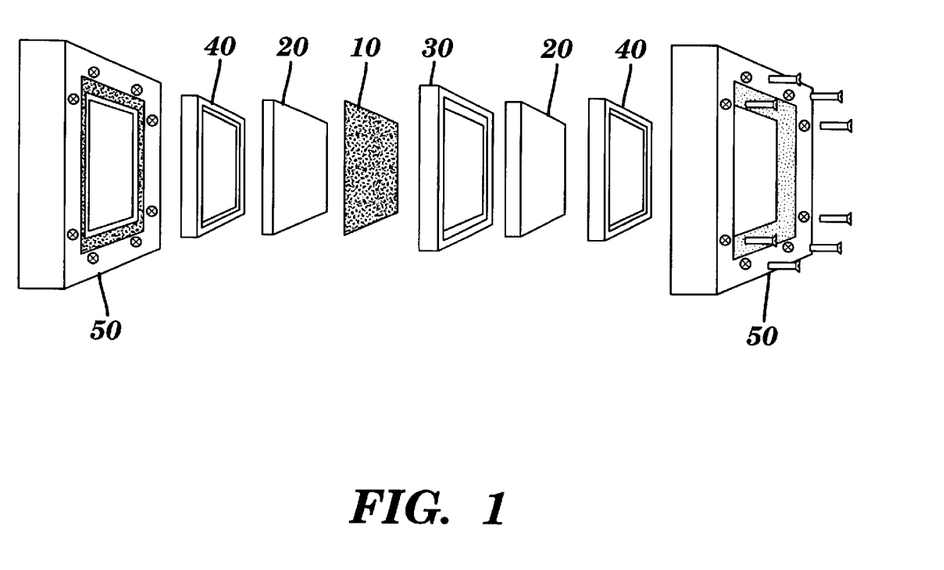
FIG. 1 illustrates an exploded view of one embodiment of a reversible holographic filter based on a thin film of bacteriorhodopsin/liquid crystal biopolymer of the present invention.

FIG. 1 shows an exploded view of one embodiment of the composite bR/oriented LC biopolymer holographic film of the present invention, where the components have been separated from each other into an exploded view to provide clarity in how the individual components of the holographic filter are arranged. The long term optical and shelf stability of the holographic media is excellent. A nitrile rubber gasket seal 30 is used to prevent dehydration of the matrix. The transparent, low scattering, and high efficiency bR/LC film 10 is sandwiched between two transparent indium-tin oxide (ITO) electrodes 20 (Applied Laboratories Films, Boulder, Colo.). The film 10 and the ITO electrodes 20 are combined with TEFLON gaskets 40 and black anodized aluminum holders 50 to provide a reversible holographic filter. Upon the application of a small electric field of less than 10V, the dipoles (formed by the poling process of fabricating the oriented LC biopolymer) reorient themselves in the "on" or "off" position. The "on"state displays birefringence and the "off" state shows no birefringence thus increasing the modulation of birefringence and resulting in higher overall dynamic diffraction efficiencies.

Thus, another aspect of the present invention pertains to a holographic grating comprising an optical layer having a first major surface and a second major surface on the side opposite to the first major surface, which layer comprises an oriented structure of a liquid crystal polypeptide having an oriented structure and bacteriorhodopsin, wherein at least a portion of said bacteriorhodopsin is incorporated within the oriented structure of said polypeptide and wherein said oriented structure is laminar with the planes of the laminar structure being aligned perpendicular to at least one of the first and second major surfaces.

Further optimization of the oriented LC/bR type materials may include the evaluation of physical conditions such as pH and temperature in order to take full advantage of the liquid crystal properties of the biopolymer, such as the PBLG biopolymer.

Also, narrowing the molecular weight distribution of the biopolymer may optimize the diffraction efficiency and erasure time of the oriented LC biopolymer/bR film. Poly (γ-benzyl-L-glutamate), PBLG, and poly(γ-methyl-L-glutamate), PMLG, both capable of assuming an α-helical conformation in helicogenic solvents such as methylene chloride and m-cresol, are available from Sigma Chemical Co., St. Louis, Mo., in several molecular weight ranges: 15–30, 30–70, 70–150, and 150–350 kD for PBLG and 10–50 and greater than 100 kD for PMLG. Several methods of batch fractionation may be employed to narrow the molecular weight distribution. These may be briefly summarized under two headings, although variations in procedure may be utilized.

In the approach of phase separation at low temperature, the temperature of a dilute solution is lowered to a value designed to separate about 10% of the polymer in the concentrated phase. As the temperature is lowered, portions of the concentrated phase separate yielding a product which is not fully equilibrated. Equilibrium is achieved by vigorously stirring the two phase system for several hours with close temperature control. The concentrated phase is allowed to settle and is then collected and dried or refractionated by addition of more nonsolvent and repeating the process. Fractions of lower molecular weight may be collected from the polymer poor phase in a similar manner. A variant of this is to allow separation into two phases of about equal size. The polymer rich phase, which is also richer in the higher molecular weight species, must then be refractionated in a cascade technique, the Meyerhoff technique, to obtain a sufficiently narrow distribution.

In the second approach of coacervate extraction, fractionating polymers of medium and lower molecular weight is typically performed using solvent-nonsolvent systems. The process starts with a dilute polymer solution (0.1–1.0%) to which is gradually added a nonsolvent until a quantity of polymer rich phase has formed. To achieve better equilibrium, the two phase system is heated until homogeneity is reestablished. It is then slowly cooled back to the temperature of fractionation, stirred, allowed to settle, and separated. This phase may be subject to additional fractionations to further narrow the distribution. Also, addition of more nonsolvent to the dilute phase will induce the next phase separation. The most useful solvents and nonsolvents are the moderately good ones, i.e., not excellent in either their ability to dissolve or exclude the polymer.

Another aspect of this invention pertains to methods of preparing an optical element, which methods comprise the steps of (a) providing a biopolymer solution comprising a biopolymer in a helicogenic solvent, which biopolymer forms an α-helix structure in the biopolymer solution; (b) dispensing the biopolymer solution between a pair of electrodes, which biopolymer solution has a surface; (c) applying an electric field between the electrodes and parallel to the surface of the biopolymer solution to thereby orient the biopolymer with respect to the electric field, wherein the helicogenic solvent evaporates upon the application of the electric field to form an oriented biopolymer film; and (d) incorporating a photoresponsive compound into the biopolymer film.

Solutions of polymers may be prepared by dissolving dry polymer powder in an appropriate solvent. Biopolymers that form α-helical structures in solution are preferred because the geometry of the α-helix permits dipoles to form and allows the helices to pack in an ordered manner. The dipoles associated with the polar moieties of the biopolymer are cumulatively directed along the molecular axis (i.e., the long axis or center line of the helix). Application of an electric field induces the polymers to become ordered parallel to each other and also to assume a characteristic orientation with respect to the applied electric field.

In one embodiment of the methods of preparing an optical element of the present invention, step (d) comprises contacting a solution of the photoresponsive compound, such as photochromic bacteriorhodopsin, a doping solvent, and, optionally, other additives such as a surfactant and a polymer binder, onto the biopolymer film and subsequently evaporating the doping solvent. In one embodiment, step (d) comprises reacting a reactive precursor of the photoresponsive compound, such as bacteriorhodopsin, with a reactive precursor of the biopolymer to form the photoresponsive compound covalently bonded to the biopolymer. In one embodiment, the biopolymer solution is dispensed into a mold in step (b), and the oriented biopolymer film is removed from the mold subsequent to step (c).

In one embodiment of the methods of preparing an optical element of this invention, the biopolymer solution is dispensed onto a temporary carrier substrate in step (b), and the oriented biopolymer film is removed from the temporary carrier substrate subsequent to step (c). Suitable temporary carrier substrates may be a variety of rigid and flexible substrates either which have poor adhesion to the oriented biopolymer film such that the oriented biopolymer film may be delaminated from the substrate or which develop poor adhesion to the oriented biopolymer film upon exposure to a solvent-based or aqueous-based solution. Suitable temporary carrier substrates include, but are not limited to, glass; rigid plastics such as polycarbonates, acrylics, and polytetrafluoroethylene; flexible plastics, such as polycarbonates and polyesters; and flexible papers, such as polyethylene-coated papers and silicone-coated papers.

EXAMPLES

Several embodiments of the present invention are described in the following examples, which are offered by way of illustration and not by way of limitation.

Example 1

Oriented PBLG films were prepared using the method described in U.S. Pat. No. 5,512,218 to Gresser et al. at a strength of 2.0 kV/cm using a 2.5% by weight solution of PBLG (62.5 mg) in methylene chloride (2.5 ml). Briefly, the field was applied parallel to the plane of the solution in an electrode cell machined from a TEFLON (a trademark for polytetrafluoroethylene plastic available from E.I. Dupont de Nemours, Wilmington, Del.) block. Platinum electrodes were positioned so that the center line of the electrode was in contact with the solution layer thus minimizing field distortion at the edges of the electrodes. The power source, a Del Electronics Model RHVS 60-300P with an output of 60 kV DC at 5 mA, enabled high aligning fields to be applied over a 1.5 inch electrode gap. The films were allowed to remain under the electric field for one hour and then were removed from the mold. This provided films with an approximate thickness of 35 microns. Light-induced birefringence changes of films which have been prepared by solvent evaporation in the presence of the aligning field may be monitored by polarized optical microscopy.

The photoresponsive compound, bacteriorhodopsin, was incorporated in the oriented or aligned PBLG films either by covalent coupling, such as by using an oriented PBLG film that had been hydrolyzed to convert some of its ester groups to a reactive precursor having carboxylic acid groups, or by doping with bR. Covalent coupling of the bR to the PBLG film was done using dicyclohexylcarbodiimide (DCC). Lyophilized engineered bacteriorhodopsin $bR_{D96N}$ (2 mg or $7.69 \times 10^{-8}$ mol) was dissolved in 5 ml of dimethylformamide (DMF) containing 3.3 mg of DCC coupling agent to produce a bacteriorhodopsin reactive precursor for reaction by covalent bonding to a hydrolyzed oriented PBLG film. To this solution was added the oriented PBLG film (32 mg) that had been hydrolyzed, and the reaction was allowed to proceed at room temperature for 5 minutes. The polymer film was removed from the solution and dried at 70° C. for 16 hours.

Doping was performed by exposing the hydrolyzed oriented PBLG films for 1 hour at room temperature to a 0.3 ml solution (0.666 mg/ml) of $bR_{D96N}$ (0.2 mg, purple-red crystals) in various solvents, i.e., methylene chloride, dimethyl sulfoxide (DMSO), and water. Also, doping was done by contacting the hydrolyzed oriented PBLG films to a solution of $bR_{D96N}$, such as 10% $BR_{D96N}$ in a gelatin polymer binder and a non-ionic surfactant at a pH of 9.6. Films obtained from doping in water with the gelatin and a surfactant present were pressed at 10,000 psi for 1 hour at 50° C. Upon viewing under a microscope equipped with a Polaroid Microcam (Fisher Scientific Micromaster Phase Contrast Microscope 12-561-3FAZ, FW97-13-1030), the birefringence patterns as a result of electronic anisotropy of the polymer were well defined and resolved, and appeared to be layered horizontally. When the polarizer was set at 0°, the optical micrograph of the birefringence pattern of the aligned PBLG film had a purple-red color. When the polarizer was set at 90°, the optical micrograph had a blue-green color. The degree of alignment or orientation was determined from polarized Fourier Transfer Infrared (FTIR) spectroscopy. Infrared spectra were taken on a Perkin-Elmer (Norwalk, Conn.) 1600 Series FTIR spectrometer equipped with a gold wire grid polarizer (gold vapor deposited on a silver bromide grid, Perkin-Elmer Part 186-0243). The degree of orientation was calculated from polarized infrared spectroscopy following the method described by Marcher et al., *Macromolecules*, Vol. 21, pages 677–686 (1988). The dichroic ratios were calculated from the parallel and perpendicular orientations of the amide A (N—H stretch at 3292 $cm^{-1}$), amide I (C=O stretch at 1650 $cm^{-1}$), and amide II (N—H deformation at 1550 $cm^{-1}$) bands. The dichroic ratio, R, is related to the measured apparent order parameter: $S_m=(r-1)/(R-S)=S_\theta S_\alpha$ where $S_\theta$ is the order parameter related to the average angle which the molecular axis makes with the direction of orientation and $S_\alpha$ is the second Legendre polynomial analogue of the transition moment angle given by $S=0.153 \cos^2\alpha-1$, where $\alpha$ is the angle between the helical axis and the transition moment vector. For the Amide A band of PBLG, the experimental value of $S_\alpha$ as determined by Marcher in the above-cited reference is 0.867, and the value of a calculated angle for an alpha helix with unit pitch of 1.5 angstroms is 22.7°.

The aligned PBLG film displayed all the amide absorbances: Amide A (3292 $cm^{-1}$), Amide I(1650 $cm^{-1}$), and Amide II(1550 $cm^{-1}$). When the polarizer was set at 0°, the absorption of the Amide A band was significantly lower than when the polarizer was set at 90° C. The high dichroic ratio, based on the ratio of the Amide A peaks of 1.6, corresponds to a high degree of alignment or orientation.

The holographic recording characteristics of the $bR_{D96N}$ film were studied by forming a holographic grating due to the interference of two laser beams. A He—Cd laser was used to produce the write beam (442 nm), and a He—Ne laser (633 nm) was used for the read beam. The geometrical arrangement used for the write-beams ensured that they had equal optical paths and reduced coherence-length effects. One beam triggered a digital oscilloscope. The recorder hologram was read out using a lower intensity beam (60 mW/cm²) from the He—Ne laser at the 633 nm wavelength. This "read" laser was positioned so that its beam was incident on the holographic grating at the Bragg angle. The straight through "read" signal intensity, $I_r$, was measured using a Si-diode detector and a Melles-Griot Amplifier. The diffracted signal, $I_z$, was measured using another Si-diode, an Oriel current amplifier, the digital oscilloscope, and a Keithley DMM. Measurements of diffraction efficiency and response time were made on the films containing bR. In terms of the measured signals, the diffraction efficiency ($\eta$), as defined herein, is the ratio between the diffracted and the "read" signal intensities: $\eta=I_z/I_r$.

Figure 2:
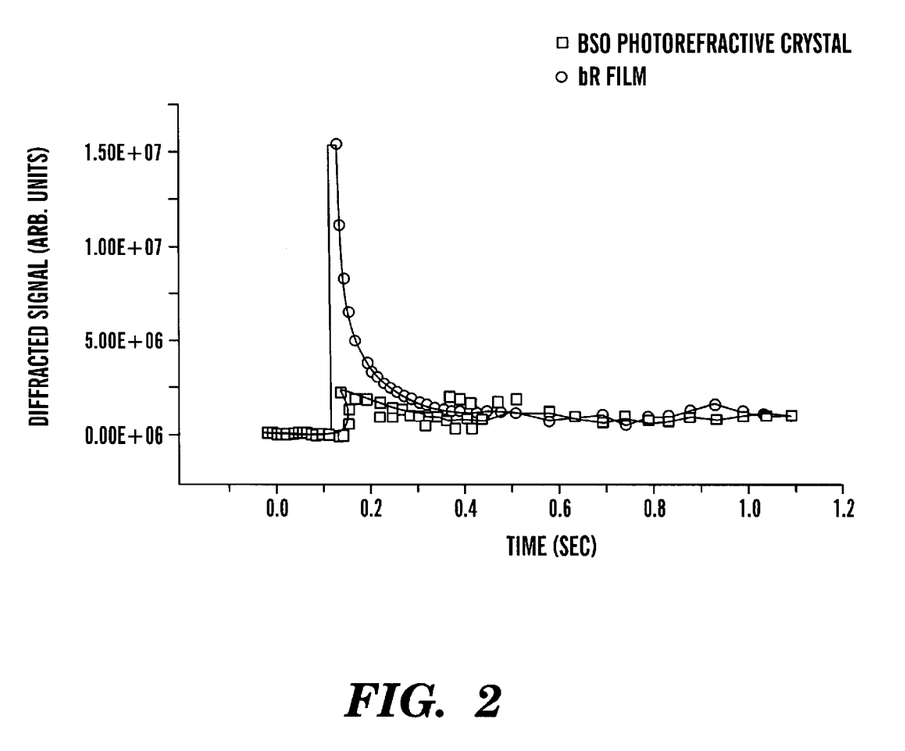
FIG. 2 shows the growth and decay of holographic gratings written with a 442 nm wavelength and read with a 633 nm wavelength under the same experimental conditions for a bacteriorhodopsin/liquid crystal biopolymer film of this invention having a thickness of 100 microns and for a 2 mm thick photorefractive BSO crystal.

The growth and decay of holographic gratings written with 442 nm wavelength and read with 633 nm wavelength under the same experimental conditions for a bR film (100 microns thick and made by the doping process with bR, gelatin, and a surfactant of this example) and a 2 mm thick photorefractive BSO crystal are shown in FIG. 2. The diffracted signal as a function of time is plotted in terms of relative units. The film containing bR showed 20 times higher diffraction efficiency compared to the inorganic BSO photorefractive crystal and showed promise for application in real-time holography. Thus, incorporating bacteriorhodopsin within an oriented biopolymer liquid crystal provided a material with high index of refraction changes upon illumination and having a diffraction efficiency 20 times higher than one of the highest performance inorganic photorefractive crystals, BSO.

Figure 4:
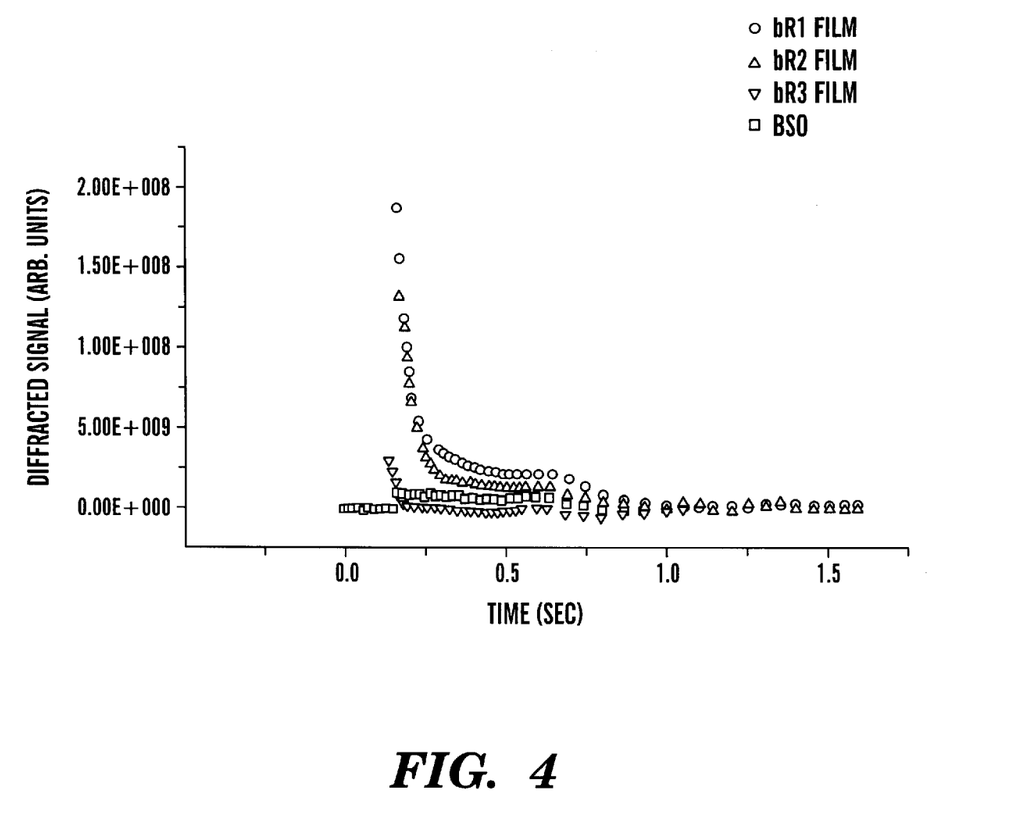
FIG. 4 shows the growth and decay of holographic gratings written with a 442 nm wavelength and read with a 633 nm wavelength under the same experimental conditions for three bacteriorhodopsin/liquid crystal biopolymer films of the present invention having a thickness of 100 microns and for a 2 mm thick photorefractive BSO crystal.

For the $bR_{D96N}$/PBLG films, the typical dependence of the diffraction efficiencies upon time and exposure as compared to a BSO photorefractive crystal, is shown in FIG. 4. The growth and decay of holographic gratings written with 442 nm wavelength and read with 634 nm wavelength under the same experimental conditions for three bR films (100 micron thickness and made by the doping process of this example) and a 2 mm thick photorefractive BSO crystal. The diffracted signal as a function of time is plotted in terms of relative units. As noted in the discussion of FIG. 1, one bR film has 20 times higher diffraction efficiency compared to the BSO photorefractive crystal, showing that this bR/oriented LC material is an ideal candidate for application in real time holography. The other two bR films had a lower diffraction efficiency than the best bR film, but still higher than the BSO crystal. This may be attributed to process variations in preparing the bR films.

Holograms recorded in these materials consist of bulk space charge patterns. An interference pattern acting upon a "poled" material will generate a pattern of electronic charge carriers that are free to move. Carriers move to areas of low optical illumination where they get trapped. This effect forms patterns of net space charge, thus creating an electrical field pattern. As PMLG has strong ferroelectric properties, the electrical field pattern creates a corresponding refractive-index variation pattern, which means a phase hologram. These holograms can immediately be reconstructed with a laser beam different from the beams creating the hologram. The hologram can also be erased and a new hologram can be recorded in the bR/oriented LC material. This reversible real-time recording and processing enables the testing of a variety of different documents encoded with different patterns, and their comparison with a corresponding master pattern database. The bR/oriented LC response time of about 1 second is satisfactory for security verification tasks based on an all-optical correlator system.

Example 2

The methyl ester of polyglutamic acid, poly(γ-methyl-L-glutamate), PMLG, was dissolved in m-cresol at 100° C. to form a 2% by weight solution. The solution was cast on clean glass slides which were then dried in vacuum at 95° C. for three hours. The films were removed from the slide by immersion in deionized water and again dried. From the volume of solution used and its concentration, the polymer content of the films was calculated to be 85%, indicating the presence of about 15% m-cresol which acted as a plasticizer. The thickness of the films was approximately 15 microns.

Figure 3:
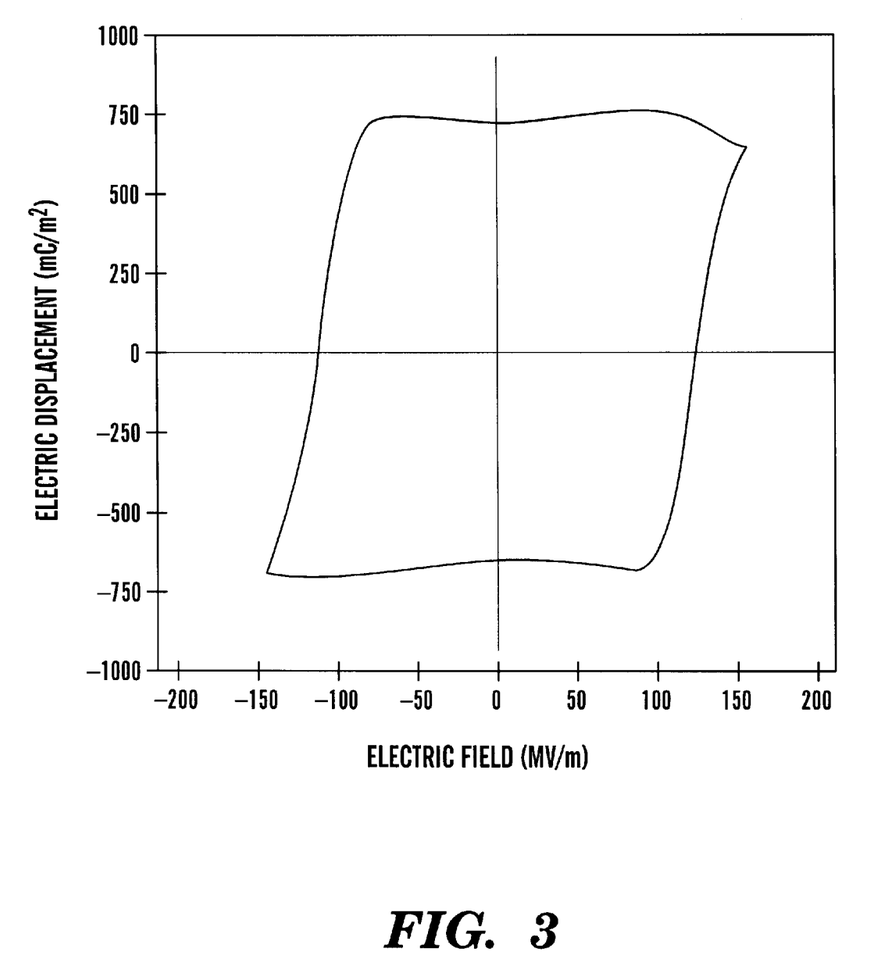
FIG. 3 shows a ferroelectric hysteresis curve of electric displacement versus field strength for poly(γ-methyl-L-glutamate).

Gold electrodes were evaporated on each side of the film. The overlapped electrode area was 0.5 cm by 1.4 cm. The films were poled in a dry silicone oil bath at room temperature. A field sweeping technique was employed to minimize ionic conduction. The field was incrementally increased to 150 MV/m overnight before poling. After the field sweeping procedure, the sample was then poled at a maximum applied field of ±150 MV/m. The applied electric field and current were recorded and from these data, the current density versus electric field strength was plotted. Integration of these data gives the electric displacement versus electric field curve, that is, the ferroelectric hysteresis loop, as shown in FIG. 3. The remanent polarization (Pr) and coercive field strength ($E_c$) for PMLG was 655 $mC/m^2$ and 120 MV/m, respectively, values much higher than synthetic ferroelectric polymers such as polyvinylidene fluoride (PVDF) where Pr is 52.6 $mC/m^2$ and $E_c$ is 50 MV/m. This data demonstrates the strong orientation or alignment and ferroelectric behavior possible with PMLG.

While the invention has been described in detail and with reference to specific and general embodiments thereof, it will be apparent to one skilled in the art that various changes and modifications can be made therein without departing from the spirit and scope thereof.

What is claimed is:

1. A method of preparing an optical element, said method comprising the steps of:

(a) providing a biopolymer solution comprising a biopolymer in a heliogenic solvent, said biopolymer forming an α-helical structure in said biopolymer solution;

(b) dispensing said biopolymer solution between a pair of electrodes, said biopolymer solution having a surface;

(c) applying an electric field between said electrodes and parallel to said surface of said biopolymer solution to thereby orient said biopolymer with respect to said electric field, said heliogenic solvent evaporating upon said application of said electric field to form an oriented biopolymer film; and (d) incorporating a photoresponsive compound into said oriented biopolymer film.

2. The method of claim 1, wherein step (d) comprises contacting a solution comprising said photoresponsive compound and a doping solvent onto said oriented biopolymer film and subsequently evaporating said doping solvent.

3. The method of claim 2, wherein said photoresponsive compound is bacteriorhodopsin.

4. The method of claim 1, wherein said biopolymer solution is dispensed into a mold in step (b) and said oriented biopolymer film is removed from said mold subsequent to step (c).

5. The method of claim 1, wherein said biopolymer solution is dispensed onto a temporary carrier substrate in step (b) and said oriented biopolymer film is removed from said temporary carrier substrate subsequent to step (c).

* * * * *